(12) United States Patent
Kim et al.

(10) Patent No.: US 9,432,604 B2
(45) Date of Patent: Aug. 30, 2016

(54) IMAGE SENSOR CHIPS

(71) Applicant: Samsung Electronics Co., Ltd., Suwon-Si, Gyeonggi-Do (KR)

(72) Inventors: Tae Chan Kim, Yongin-si (KR); Min Ho Kim, Seongnam-si (KR); Dong Ki Min, Seoul (KR); Sang Chul Sul, Suwon-si (KR); Tae Seok Oh, Seoul (KR); Kwang Hyun Lee, Seongnam-si (KR); Tae Yon Lee, Seoul (KR); Jung Hoon Jung, Hwaseong-si (KR); Young Gu Jin, Osan-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 300 days.

(21) Appl. No.: 14/051,993

(22) Filed: Oct. 11, 2013

(65) Prior Publication Data

US 2014/0104473 A1  Apr. 17, 2014

Related U.S. Application Data

(60) Provisional application No. 61/713,175, filed on Oct. 12, 2012.

(30) Foreign Application Priority Data

Mar. 13, 2013  (KR) ........................ 10-2013-0026459

(51) Int. Cl.
| | | |
|---|---|---|
| H04N 5/335 | (2011.01) | |
| H04N 5/225 | (2006.01) | |
| H01L 31/062 | (2012.01) | |
| H01L 27/14 | (2006.01) | |
| H04N 5/374 | (2011.01) | |
| H01L 27/146 | (2006.01) | |

(52) U.S. Cl.
CPC ........ *H04N 5/374* (2013.01); *H01L 27/14627* (2013.01); *H01L 27/14634* (2013.01)

(58) Field of Classification Search
CPC .. H04N 5/335; H04N 5/355; H04N 5/23212; H04N 5/23232; H01L 27/14627; G06T 3/00; G06T 3/68–3/0081
USPC .......... 348/294, 333.01, 308, 302, 340, 345; 358/482, 513, 514; 257/222, 223, 257/225–234, 257, 258, 292, 294, 431–448
See application file for complete search history.

(56) References Cited

U.S. PATENT DOCUMENTS

| | | |
|---|---|---|
| 5,665,959 A | 9/1997 | Fossum et al. |
| 7,825,971 B2 | 11/2010 | Hynecek |
| 8,319,855 B2 | 11/2012 | Yang et al. |
| 8,420,996 B2 | 4/2013 | Rissa et al. |
| 8,633,996 B2 | 1/2014 | Charbon et al. |
| 2008/0083939 A1* | 4/2008 | Guidash ............ H01L 27/14634 257/292 |
| 2009/0310006 A1 | 12/2009 | Sugiyama et al. |
| 2010/0091133 A1* | 4/2010 | Lim ...................... G02B 27/58 348/223.1 |

(Continued)

*Primary Examiner* — Sinh Tran
*Assistant Examiner* — Xi Wang
(74) *Attorney, Agent, or Firm* — Harness, Dickey & Pierce, PLC

(57) ABSTRACT

An image sensor chip includes a first wafer and a second wafer. The first wafer includes an image sensor having a plurality of sub-pixels, each of which is configured to detect at least one photon and output a sub-pixel signal according to a result of the detection. The image processor is configured to process sub-pixel signals for each sub-pixel and generate image data. The first wafer and the second wafer are formed in a wafer stack structure.

20 Claims, 11 Drawing Sheets

(56) References Cited

U.S. PATENT DOCUMENTS

| | | | |
|---|---|---|---|
| 2010/0141802 A1* | 6/2010 | Knight | H04N 5/2252 348/240.3 |
| 2010/0329425 A1 | 12/2010 | Guo et al. | |
| 2011/0042573 A1 | 2/2011 | Kim et al. | |
| 2011/0129165 A1* | 6/2011 | Lim | H04N 5/23212 382/255 |
| 2011/0135208 A1 | 6/2011 | Atanassov et al. | |
| 2011/0235771 A1 | 9/2011 | Aull et al. | |
| 2011/0249148 A1 | 10/2011 | Prescher et al. | |
| 2012/0016634 A1 | 1/2012 | Brodsky et al. | |
| 2012/0057059 A1 | 3/2012 | Eldesouki et al. | |
| 2012/0075615 A1 | 3/2012 | Niclass et al. | |
| 2012/0281921 A1* | 11/2012 | Dowell | G06K 9/6203 382/195 |

\* cited by examiner

IMAGE SENSOR CHIPS

CROSS-REFERENCE TO RELATED APPLICATIONS

This application claims priority under 35 U.S.C. §119 to U.S. Provisional Patent Application 61/713,175 filed on Oct. 12, 2012, and Korean Patent Application No. 10-2013-0026459 filed on Mar. 13, 2013, the entire contents of each of which is hereby incorporated by reference.

BACKGROUND

1. Field

Example embodiments of inventive concepts relate to image sensor chips, and more particularly, to image sensor chips implemented as wafer stacks.

2. Description of Conventional Art

Complementary metal oxide semiconductor (CMOS) image sensors are sensing devices using CMOS. CMOS image sensors have lower manufacturing cost and smaller size than charge coupled device (CCD) image sensors having a high-voltage analog circuit and thus have an advantage of low power consumption. In addition, the performance of CMOS image sensors has been improved as compared to an early development stage, and therefore, CMOS image sensors are usually used for various electronic appliances including portable devices such as smart phones and digital cameras.

With the various uses of CMOS image sensors, the minimization of a pixel array and a driving circuit in CMOS image sensors has been demanded. In addition, high-definition images are demanded with the minimization. Therefore, approaches for meeting these demands have been researched and developed.

SUMMARY

According to some example embodiments of inventive concepts, an image sensor chip includes: a first wafer and a second wafer. The first wafer includes an image sensor having a plurality of sub-pixels, each of which is configured to detect at least one photon, and output a sub-pixel signal according to a result of the detection. The second wafer includes an image processor configured to process sub-pixel signals for each sub-pixel, and generate image data. The first wafer and the second wafer are formed in a wafer stack structure.

According to at least some example embodiments, the image sensor chip may further include: a micro lens array having first through n-th micro lenses corresponding to first through n-th sub-pixel groups. The sub-pixels may be grouped into the first through n-th sub-pixel groups each of which may include at least one of the sub-pixels.

The image processor may be configured to compare at least two of first through n-th sub-pixel images respectively output from the first through n-th sub-pixel groups, and generate angular information.

The image processor may be configured to perform scaling and registration on the first through n-th sub-pixel images, and generate a high-resolution image. The image processor may be configured to generate depth data corresponding to the high-resolution image using the angular information. The image processor may be configured to refocus the high-resolution image using the angular information. The image processor may be further configured to: scale the high-resolution image; compare the scaled high-resolution image with one of the first through n-th sub-pixel images; and correct a reconstruction error.

According to other example embodiments of inventive concepts, an image sensor chip includes: a first wafer and a second wafer. The first wafer includes an image sensor having a plurality of sub-pixels, each of which is configured to detect at least one photon and output a sub-pixel signal according to a result of the detection. The second wafer includes an image processor configured to process sub-pixel signals for each pixel, and generate image data. The first wafer and the second wafer are formed in a wafer stack structure, and each pixel includes at least one sub-pixel.

According to at least some example embodiments, the image sensor chip may further include a micro lens array having first through m-th micro lenses corresponding to first through m-th pixel groups. The sub-pixels may be grouped into first through n-th sub-pixel groups each of which includes at least one of the sub-pixels, and the first through n-th sub-pixel groups may be grouped into the first through m-th pixel groups each of which includes at least one of the first through n-th sub-pixel groups.

According to at least some example embodiments, the image processor may be further configured to generate angular information based on a comparison between at least two of first through m-th pixel images output from the first through m-th pixel groups. The image processor may be further configured to perform scaling and registration on the first through m-th pixel images, and generate a high-resolution image.

At least one other example embodiment provides an image sensor chip including a first wafer having an image sensor and a second wafer having an image processor. The image processor is configured to: generate a plurality of sub-pixel images of an object based on sub-pixel signals output from a plurality of sub-pixel groups of a sub-pixel array; generate angular information associated with at least a first portion of the object based on a comparison between at least two of the plurality of sub-pixel images; generate depth data associated with at least the first portion of the object based on the angular information; and generate a resultant image based on the plurality of sub-pixel images using the angular information and the depth data.

The image processor may be further configured to scale and register the resultant image to generate a high-resolution image. The image processor may be further configured to: scale the high-resolution image; compare the scaled high-resolution image with one of the plurality of sub-pixel images; and correct a reconstruction error.

According to at least some example embodiments, the angular information associated with the first portion of the object may include position information associated with sub-pixels in the plurality of sub-pixel groups having sensed the first portion of the object and/or a relative position of the plurality of sub-pixel groups in the sub-pixel array.

BRIEF DESCRIPTION OF THE DRAWINGS

The above and other features and advantages of inventive concepts will become more apparent by describing in detail example embodiments thereof with reference to the attached drawings in which.

DETAILED DESCRIPTION

Figure 1:
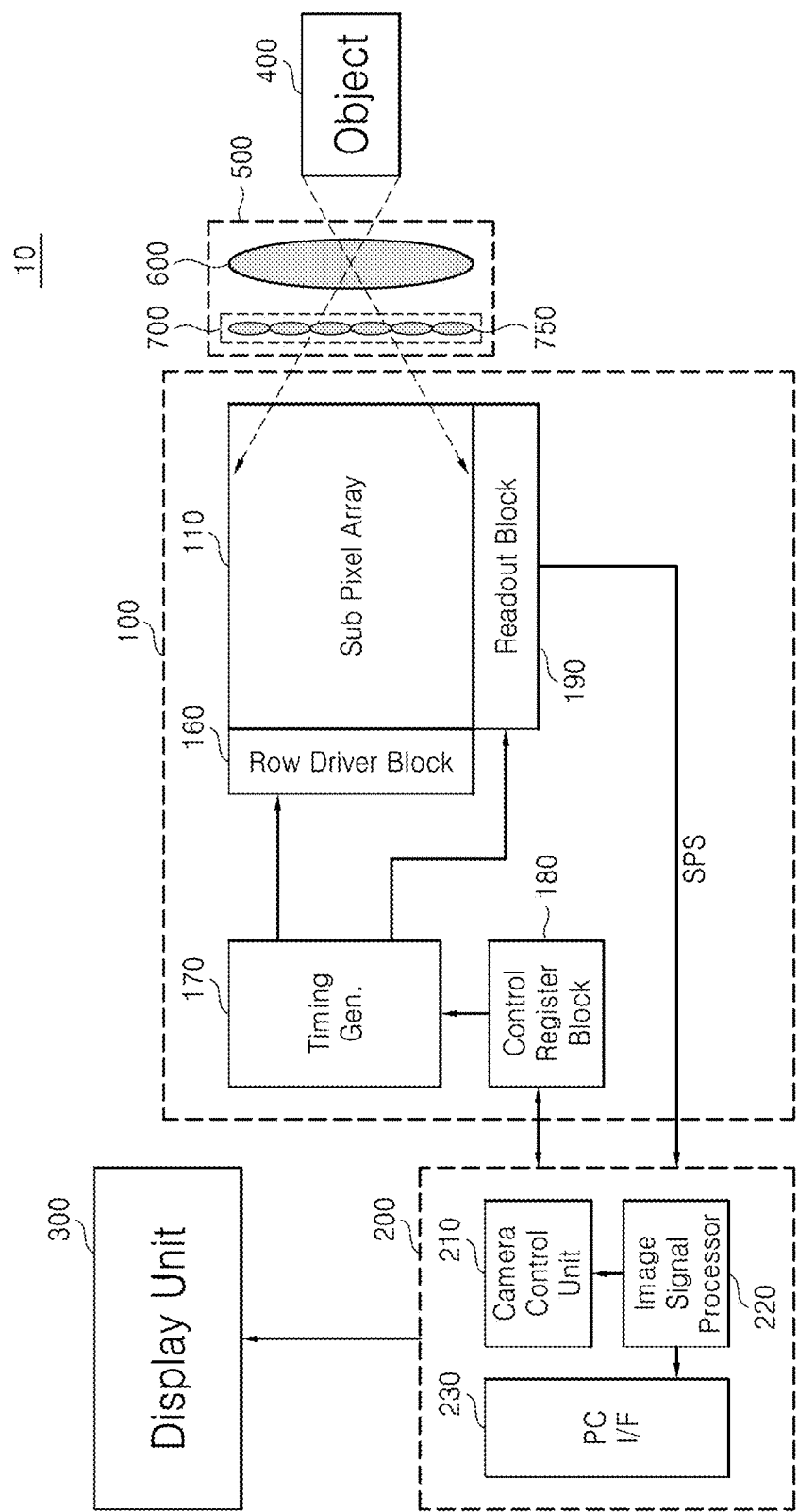
FIG. 1 is a block diagram of an image processing system according to some example embodiments of inventive concepts.

Inventive concepts now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of an image processing system 10 according to some example embodiments of inventive concepts. The image processing system 10 may include an image sensor 100, an image processor or a digital signal processor (DSP) 200, a display unit 300, and a lens unit 500. The image sensor 100 may include a sub-pixel array 110, a row driver block 160, a timing generator 170, a control register block 180, and a readout block 190.

The image sensor 100 may be controlled by the image processor 200 to sense an object 400 captured through the lens unit 500. The image processor 200 may output an image of the object 400, which has been sensed by the image sensor 100, to the display unit 300. At this time, the display unit 300 may be any device that can output an image. For instance, the display unit 300 may be implemented as a computer, a mobile phone, or an electronic device equipped with a camera.

The image processor 200 may include a camera control unit 210, an image signal processor 220, and a personal computer interface (PC I/F) 230. The camera control unit 210 controls the control register block 180. The camera control unit 210 may control the image sensor 100, and more specifically, the control register block 180 using an inter-integrated circuit ($I^2C$), but the scope of inventive concepts is not restricted thereto.

The image signal processor 220 receives a sub-pixel signal SPS (an output signal of the readout block 190) and processes the sub-pixel signal SPS in units of sub-pixels or pixels into image data nice for people to look at. The image signal processor 220 outputs the image data to the display unit 300 through the PC I/F 230.

Figure 3:
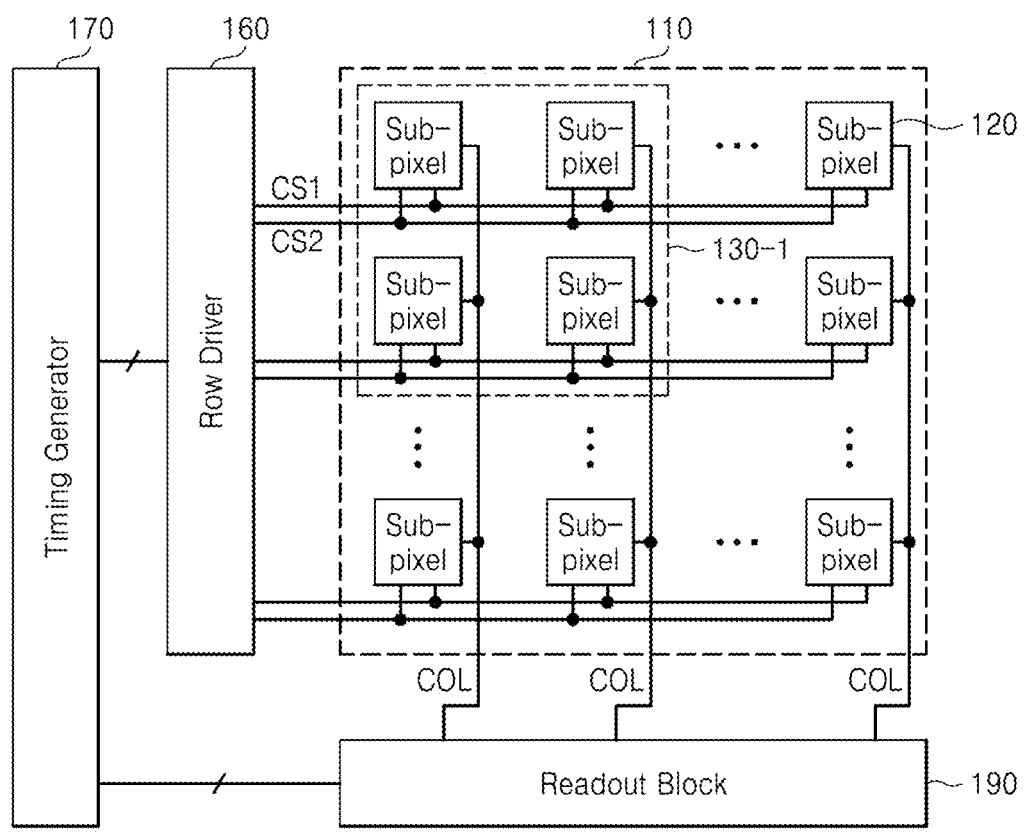
FIG. 3 is a diagram for explaining a method of processing a sub-pixel signal of a sub-pixel array illustrated in FIG. 1 according to some example embodiments of inventive concepts.
Figure 4:
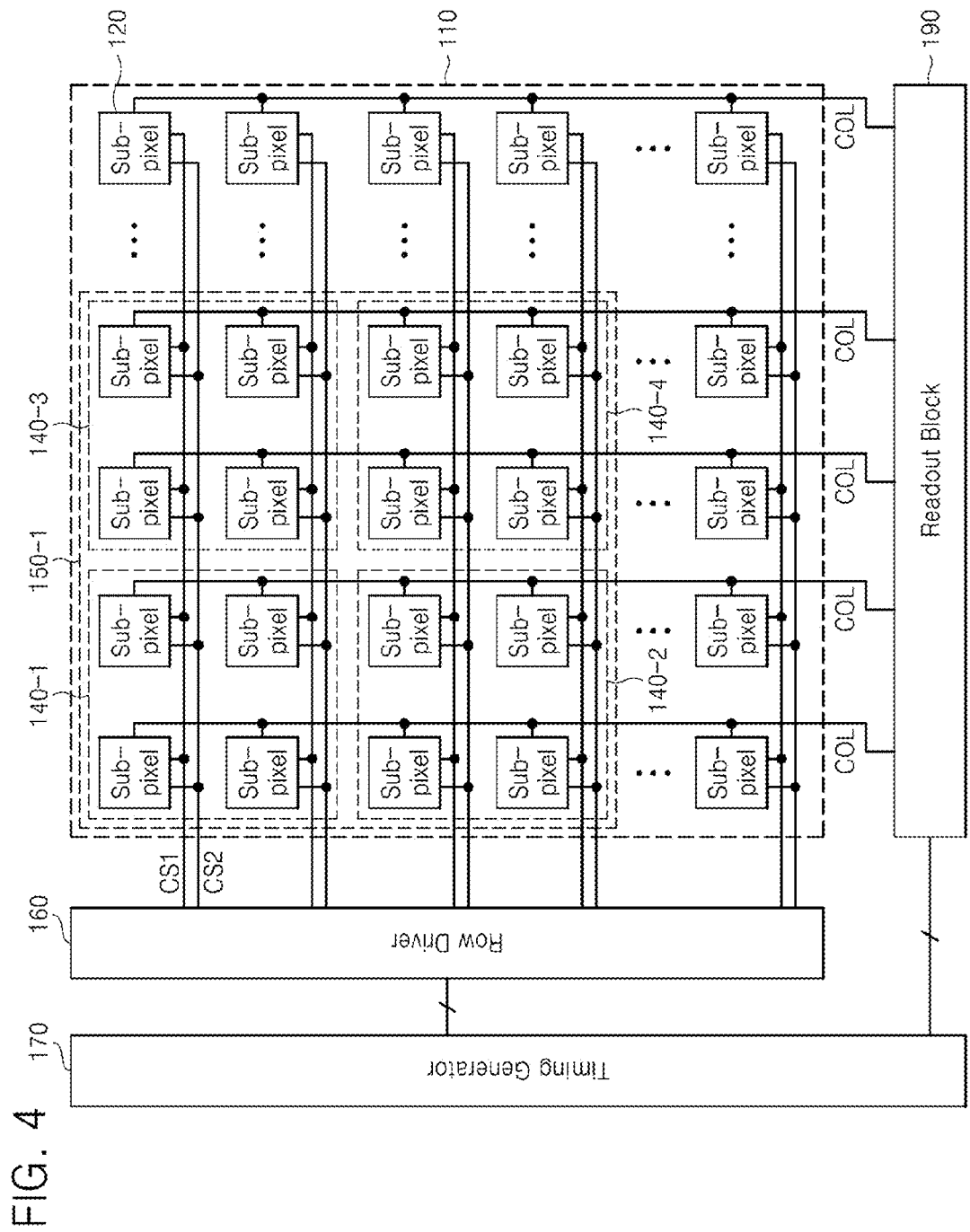
FIG. 4 is a diagram for explaining a method of processing a sub-pixel signal of the sub-pixel array illustrated in FIG. 1 according to other example embodiments of inventive concepts.

The sub-pixel array 110 may include a plurality of sub-pixels (120 in FIGS. 3 and 4). Each sub-pixel 120 may sense light incident through the lens unit 500 and generate the sub-pixel signal SPS according to the control of the row driver block 160. The sub-pixel signal SPS may be a digital signal having at least two levels. The sub-pixel 120 will be described in detail with reference to FIG. 5.

The timing generator 170 may output a control signal or a clock signal to the row driver block 160 and the readout block 190 to control the operations or the timing of the row driver block 160 and the readout block 190. The control register block 180 is controlled by the camera control unit 210 and stores various commands necessary for the operation of the image sensor 100.

The row driver block 160 drives the sub-pixel array 110 in row units. The row driver block 160 may provide a first control signal (CS1 in FIGS. 3 and 4) and a second control signal (CS2 in FIGS. 3 and 4) for each sub-pixel 120 in the sub-pixel array 110. In other words, the row driver block 160 may decode a control signal from the timing generator 170 and apply the first control signal CS1 and the second control signal CS2 to each of rows in the sub-pixel array 110.

The sub-pixel array 110 outputs the sub-pixel signal SPS from a row selected by the first control signal CS1 and the second control signal CS2, which are provided from the row driver block 160, to the readout block 190. The readout block 190 temporarily stores the sub-pixel signal SPS from the sub-pixel array 110 and senses and amplifies the sub-pixel signal SPS before outputting it. At this time, the readout block 190 may include a column memory (e.g., static random access memory (SRAM)) (not shown) provided for each of columns in the sub-pixel array 110 to temporarily store the sub-pixel signal SPS and a sense amplifier (not shown) to sense and amplify the sub-pixel signal SPS.

The lens unit 500 may include a main lens 600 and a micro-lens array 700. The main lens 600 may be implemented in size corresponding to the sub-pixel array 110. The main lens 600 enables an image of the object 400 to be formed. The micro-lens array 700 may include a plurality of micro lenses 750. Each of the micro lenses 750 may be implemented in size corresponding to a sub-pixel group (e.g., 130-1 in FIG. 3) or a pixel group (e.g., 150-1 in FIG. 4) in the sub-pixel array 110. Each micro lens 750 focuses an image in the sub-pixel group 130-1 or the pixel group 150-1.

Figure 2:
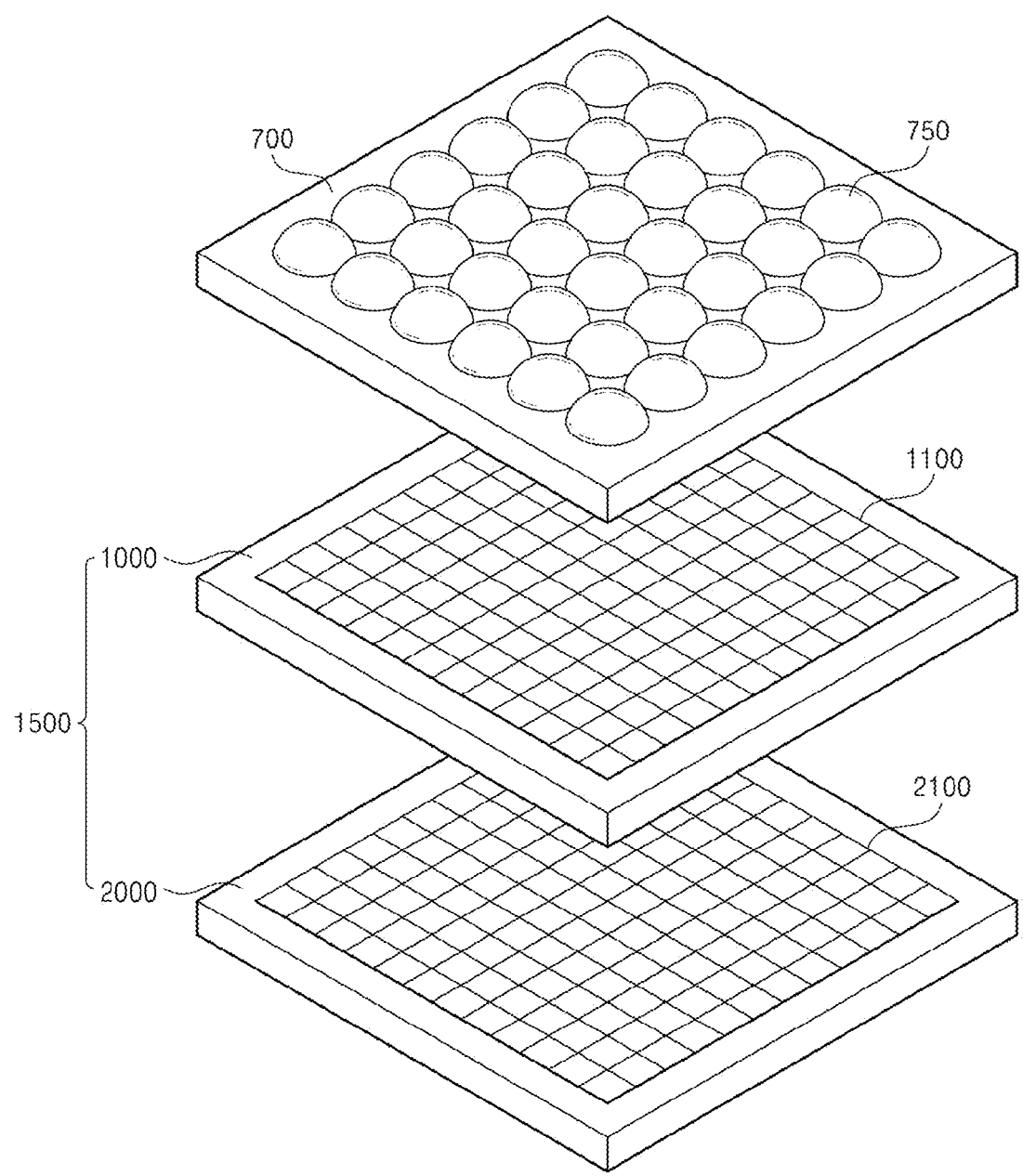
FIG. 2 is a block diagram of a wafer stack for explaining an example embodiment of a method of manufacturing the image processing system illustrated in FIG. 1.

FIG. 2 is a block diagram of a wafer stack for explaining an example embodiment of a method of manufacturing the image processing system 10 illustrated in FIG. 1. Referring to FIGS. 1 and 2, a first wafer 1000 includes a plurality of dies 1100. Each of the dies 1100 may include the sub-pixel array 110 illustrated in FIG. 1. In other example embodiments, each die 1100 may include the image sensor 100 illustrated in FIG. 1.

A second wafer 2000 includes a plurality of dies 2100. Each of the dies 2100 may include the image signal processor 220 illustrated in FIG. 1. In other example embodiments, each dies 2100 may be the image processor 200 illustrated in FIG. 1.

Here, the image sensor 100 and the image processor 200 may be implemented in a wafer stack in which circuits included in the image sensor 100 and the image processor 200 are adequately embodied. In other words, the dies 1100 in the first wafer 1000 and the dies 2100 in the second wafer 2000 may form a single chip (e.g., an image sensor chip 1500 in a wafer stack structure). In the image sensor chip 1500 including the image sensor 100 and the image processor 200 in the wafer stack structure, circuits included in the image sensor 100 and the image processor 200 can be satisfactorily embodied.

FIG. 3 is a diagram for explaining a method of processing a sub-pixel signal SPS of the sub-pixel array 110 illustrated in FIG. 1 according to some example embodiments of inventive concepts. Referring to FIGS. 1 and 3, the sub-pixel array 110 includes a plurality of sub-pixels 120 arranged in a matrix form. Each sub-pixel 120 may be called a jot. A sub-pixel pitch is less than a normal pixel pitch. The sub-pixels 120 may be grouped into first sub-pixel group 130-1 through an n-th sub-pixel group (not shown), each including a plurality of sub-pixels 120 in a matrix form. Although each of the first sub-pixel group 130-1 through the n-th sub-pixel group includes four sub-pixels 120 in the embodiments illustrated in FIG. 3, inventive concepts are not restricted to the current embodiments. The sub-pixel array 110 may output the sub-pixel signal SPS for each row along a column line COL according to the control of the timing generator 170.

A filter array (not shown) including a color filter or a shield, which transmits or shields light in a predetermined spectrum, may be placed above the sub-pixels 120 included in the sub-pixel array 110. In addition, a pixel lens array (not shown) enhancing a light gathering power of the sub-pixels 120 may be placed above the sub-pixel 120 included in the sub-pixel array 110. The structure and the operation of each of the sub-pixels 120 will be described in detail with reference to FIG. 5.

The row driver block 160 drives a plurality of the control signals CS1 and CS2 for controlling the operation of each sub-pixel 120 to the sub-pixel array 110 according to the control of the timing generator 170. The control signals CS1 and CS2 may select or reset the sub-pixel 120.

The readout block 190 includes elements (e.g., a memory and a sense amplifier circuit) that process sub-pixel signals SPS output from the sub-pixel array 110. The sub-pixel signals SPS output from the readout block 190 may form different light field images for the respective first sub-pixel group 130-1 through the n-th sub-pixel group. In other words, each of the first sub-pixel group 130-1 through the n-th sub-pixel group outputs sub-pixel signals SPS corresponding to one of first through n-th sub-pixel images that respectively pass through the micro lenses 750.

The image signal processor 220 may process the sub-pixel signals SPS corresponding to the first through n-th sub-pixel images, thereby generating angular information, depth data, and a high-resolution image, and may refocus the high-resolution image. The operations of the image signal processor 220 will be described in detail with reference to FIGS. 6A through 7.

FIG. 4 is a diagram for explaining a method of processing a sub-pixel signal SPS of the sub-pixel array 110 illustrated in FIG. 1 according to other example embodiments of inventive concepts. Referring to FIGS. 1, 3, and 4, the sub-pixels 120 may be grouped into a first sub-pixel group 140-1 through an n-th sub-pixel group (not shown) in a matrix form. Unlike the sub-pixel group (e.g., 130-1) illustrated in FIG. 3, a sub-pixel group 140-1~140-n, e.g., the first sub-pixel group 140-1, illustrated in FIG. 4 has a red filter there above, so that the first sub-pixel group 140-1 functions as a single red pixel. The image signal processor 220 may process the mean of four sub-pixel signals SPS output from the first sub-pixel group 140-1 as a pixel signal output from a single red pixel.

In addition, the first sub-pixel group 140-1 through the n-th sub-pixel group may be grouped into a first pixel group 150-1 through an m-th pixel group (not shown) each of which includes at least one of the first sub-pixel group 140-1 through the n-th sub-pixel group.

Sub-pixel signals SPS output from the first sub-pixel group 140-1 through the n-th sub-pixel group may form different light field images for the respective first pixel group 150-1 through the m-th pixel group. In other words, each of the first pixel group 150-1 through the m-th pixel group outputs sub-pixel signals SPS corresponding to one of first through m-th pixel images that respectively pass through the micro lenses 750.

In other words, the image signal processor 220 may make sub-pixel signals SPS output from each sub-pixel group (e.g., 140-1) into a pixel (for example, the sum of sub-pixel signals SPS of a single sub-pixel group is treated as a pixel signal of a single pixel) and then process sub-pixel signals SPS corresponding to the first through m-th pixel images each including a plurality of pixels, thereby generating angular information, depth data, and a high-resolution image, and the image signal processor 220 may refocus the high-resolution image.

Figure 5:
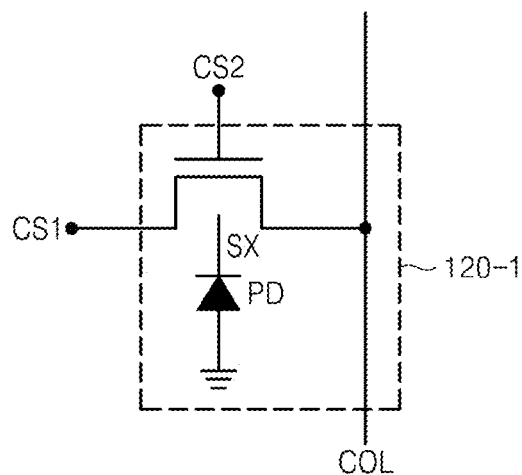
FIG. 5 is a diagram of an example embodiment of a sub-pixel illustrated in FIGS. 3 and 4.

FIG. 5 is a diagram of an example embodiment of a sub-pixel illustrated in FIGS. 3 and 4. Referring to FIGS. 3 through 5, the sub-pixel 120-1 may include a single transistor SX and a photodiode PD. It is assumed that the photodiode PD is a photoelectric conversion element in the embodiments illustrated in FIG. 5, but inventive concepts are not restricted to the current embodiments.

One end of the photodiode PD is connected to a ground and another end of the photodiode PD is connected to a body of the single transistor SX or is electrically isolated from the body. The photodiode PD may contain and retain photocharges generated in proportion to the intensity of light incident through the lens unit 500.

The single transistor SX has a source and a gate connected to the row driver block 160 to receive the first control signal CS1 and the second control signal CS2, respectively. The sub-pixel 120-1 may have three operation modes (e.g., integration mode, reset mode, and readout mode) according to the first control signal CS1 and the second control signal CS2.

In the integration mode, among photocharges (electrons and holes) generated by incident light, one type of photocharges (electrons or holes) are accumulated in the photodiode PD. In the reset mode, the photocharges accumulated in the photodiode PD are drained through the source of the drain.

In the readout mode, a sub-pixel signal SPS corresponding to the photocharges accumulated in the photodiode PD is output through a column line COL. The sub-pixel signal SPS includes an image signal and a reset signal. The image signal is a signal output in the readout mode right after the integration mode and the reset signal is a signal output in the readout mode right after the reset mode.

In the readout mode, the body voltage of the signal transistor SX may be different depending on the photocharge accumulated in the photodiode PD. The threshold voltage of the single transistor SX may vary with the body voltage. When the threshold voltage of the single transistor SX changes, the same result as obtained when a source voltage changes can be obtained. By using this principle, the sub-pixel 120-1 may output a digital pixel signal having at least two levels.

It is defined that a voltage value appearing when the first control signal CS1 is applied to the source of the single transistor SX is a source voltage, a voltage value appearing when the second control signal CS2 is applied to the gate of the single transistor SX is a gate voltage, a voltage value output to the drain of the single transistor SX is a drain voltage, and a voltage value applied to a semiconductor substrate including the single transistor SX is a substrate voltage.

In order to induce photocharge amplification by avalanche effect in the integration mode, the source voltage, the gate voltage, and the substrate voltage may be a first integration voltage, a second integration voltage, and 0V, respectively. For instance, when the single transistor SX is a P-type metal oxide semiconductor (PMOS) transistor, the first integration voltage may be 0 V and the second integration voltage may be 0 V or a positive voltage (e.g., 0 to 5 V). When the single transistor SX is an N-type metal oxide semiconductor (NMOS) transistor, the first integration voltage may be 0 V and the second integration voltage may be 0 V or a negative voltage (e.g., 0 to −5 V). When the single transistor SX enters the integration mode at the reception of voltage, the single transistor SX is deactivated and photocharge is generated corresponding to the intensity of incident light and accumulated in the photodiode PD. The drain voltage may be 0 V.

Alternatively, a high voltage (e.g., 3.3 V or higher in case of a PMOS transistor) or a low voltage (e.g., −3.3 V or lower in case of an NMOS transistor) may be applied to the source or the drain instead of the gate in order to raise photocharge amplification by avalanche effect in the integration mode.

In order to prevent photocharge from being accumulated by the photodiode PD, a particular voltage (a negative voltage for a PMOS transistor or a positive voltage for an NMOS transistor) may be applied to the source and the drain, thereby blocking photocharge from flowing into the photodiode PD. In other words, electric shutter may be realized by adjusting the voltage at the source and the drain of the single transistor SX.

In the reset mode, the source voltage, the gate voltage, and the substrate voltage may be a first reset voltage, a second reset voltage, and 0V, respectively. For instance, when the single transistor SX is a PMOS transistor, the first reset voltage may be a positive voltage of at least 1.5 V and the second reset voltage may be 0 V. When the single transistor SX is an NMOS transistor, the first reset voltage may be a negative voltage of at most −1.5 V and the second reset voltage may be 0 V. When the single transistor SX enters the reset mode at the reception of voltage, photocharge accumulated at the photodiode PD may be reset through the semiconductor substrate including the single transistor SX. The drain voltage may be 0V.

In the readout mode, the source voltage, the gate voltage, and the substrate voltage may be a first read voltage, a second read voltage, and 0V, respectively. For instance, when the single transistor SX is a PMOS transistor, the first read voltage may be a power supply voltage and the second read voltage may be lower than a threshold voltage of the single transistor SX when there is no influence from the photodiode PD. When the single transistor SX is an NMOS transistor, the first read voltage may be the power supply voltage and the second read voltage may be higher than the threshold voltage of the single transistor SX when there is no influence from the photodiode PD. The power supply voltage may be a power supply voltage of the image sensor 100 and may be −3 to 3 V. When the single transistor SX enters the readout mode at the reception of voltage, the change in the threshold voltage of the single transistor SX with respect to the photocharge accumulated at the photodiode PD may be sensed and the drain voltage Vd (e.g., the power supply voltage VDD) may be output as a sub-pixel signal SPS.

For instance, it is assumed that the single transistor SX is an NMOS transistor, the threshold voltage of the single transistor SX when there is no influence from the photodiode PD is 1 V, and the threshold voltage changes to 1.4 V when one photocharge is generated by the photodiode PD. When one photocharge is generated by the photodiode PD, the single transistor SX may be activated and the sub-pixel signal SPS of a high level (e.g., 1 V) may be output. When there is no photocharge generated by the photodiode PD, the single transistor SX may be deactivated and the sub-pixel signal SPS of a low level (e.g., 0 V) may be output.

Figure 6A:
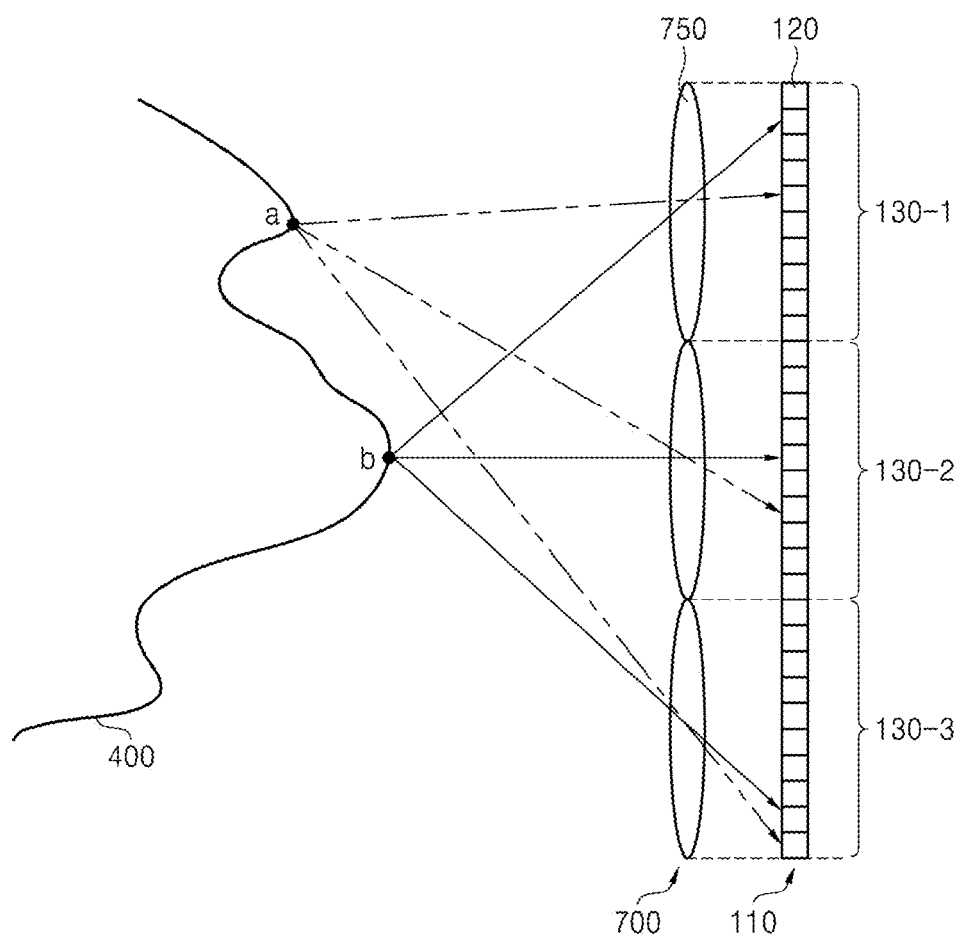
FIG. 6A is a diagram for explaining the operations of an image signal processor illustrated in FIG. 1 according to some example embodiments of inventive concepts.

FIG. 6A is a diagram for explaining example operation of the image signal processor 220 illustrated in FIG. 1 according to some example embodiments of inventive concepts. Referring to FIG. 1 and FIGS. 3 through 6A, the image signal processor 220 may sequentially receive sub-pixel signals SPS of the sub-pixel array 110 from the readout block 190. The image signal processor 220 may generate a plurality of light field images from the sub-pixel signals SPS.

When the sub-pixel signals SPS are processed as shown in FIG. 3, each of the light field images corresponds to one of the first through n-th sub-pixel images of the respective first sub-pixel group 130-1 through the n-th sub-pixel group. When the sub-pixel signals SPS are processed as shown in FIG. 4, each of the light field images corresponds to one of the first through m-th pixel images of the respective first pixel group 150-1 through the m-th pixel group. Hereinafter, a case of processing the sub-pixel signals SPS as shown in FIG. 3 will be described as an example.

The sub-pixel array 110 has a matrix form in two dimensions, but it is considered only in one dimension in a column direction for convenience' sake in the description. Referring to FIG. 6A, each of the first through third sub-pixel groups 130-1 through 130-3 in the sub-pixel array 110 includes ten sub-pixels 120, which are defined as first through tenth sub-pixels, respectively.

Light from spots "a" and "b" on the object 400 is transmitted through the micro-lens array 700 and is sensed by the first through third sub-pixel groups 130-1 through 130-3. With an assumption that the main lens 600 illustrated in FIG. 1 optically exists at an infinite distance from the micro-lens array 700, the main lens 600 is not considered in the embodiments illustrated in FIGS. 6A through 6C.

The light from the spot "a" is sensed by the fifth sub-pixel in the first sub-pixel group 130-1, the seventh sub-pixel in the second sub-pixel group 130-2, and the tenth sub-pixel in the third sub-pixel group 130-3. The light from the spot "b" is sensed by the second sub-pixel in the first sub-pixel group 130-1, the fifth sub-pixel in the second sub-pixel group 130-2, and the ninth sub-pixel in the third sub-pixel group 130-3. In other words, the light from the spot "a" or "b" is sensed by different sub-pixels in the respective first through third sub-pixel groups 130-1 through 130-3.

The image signal processor 220 may compare at least two of first through third sub-pixel images with each other and determine by which sub-pixel in each of the first through third sub-pixel groups 130-1 through 130-3 the light from the spot "a" or "b" has been sensed. The image signal processor 220 may generate angular information of the spot "a" using the determination result and the relative position of the first through third sub-pixel groups 130-1 through 130-3. The angular information includes information about the direction angle of the spot "a" with respect to the center of each of the first through third sub-pixel groups 130-1 through 130-3 or the micro lenses 750. For instance, when the angular information of the spot "a" is L(10, 8, 4, 5), it means that the spot "a" has been sensed by a sub-pixel located at the intersection between a fourth row and a fifth column in a sub-pixel group located at the intersection between a tenth row and an eighth column in the sub-pixel array 110.

Angular information of the spot "b" may be generated in substantially the same way as the angular information of the spot "a" is generated. In other embodiments, the image signal processor 220 may use a special image matching algorithm to determine by which sub-pixel in each of the first through third sub-pixel groups 130-1 through 130-3 the spot "a" or "b" has been sensed.

Consequently, the image signal processor 220 may generate angular information with respect to every spot on the object 400 using the above-described procedure.

Figure 6B:
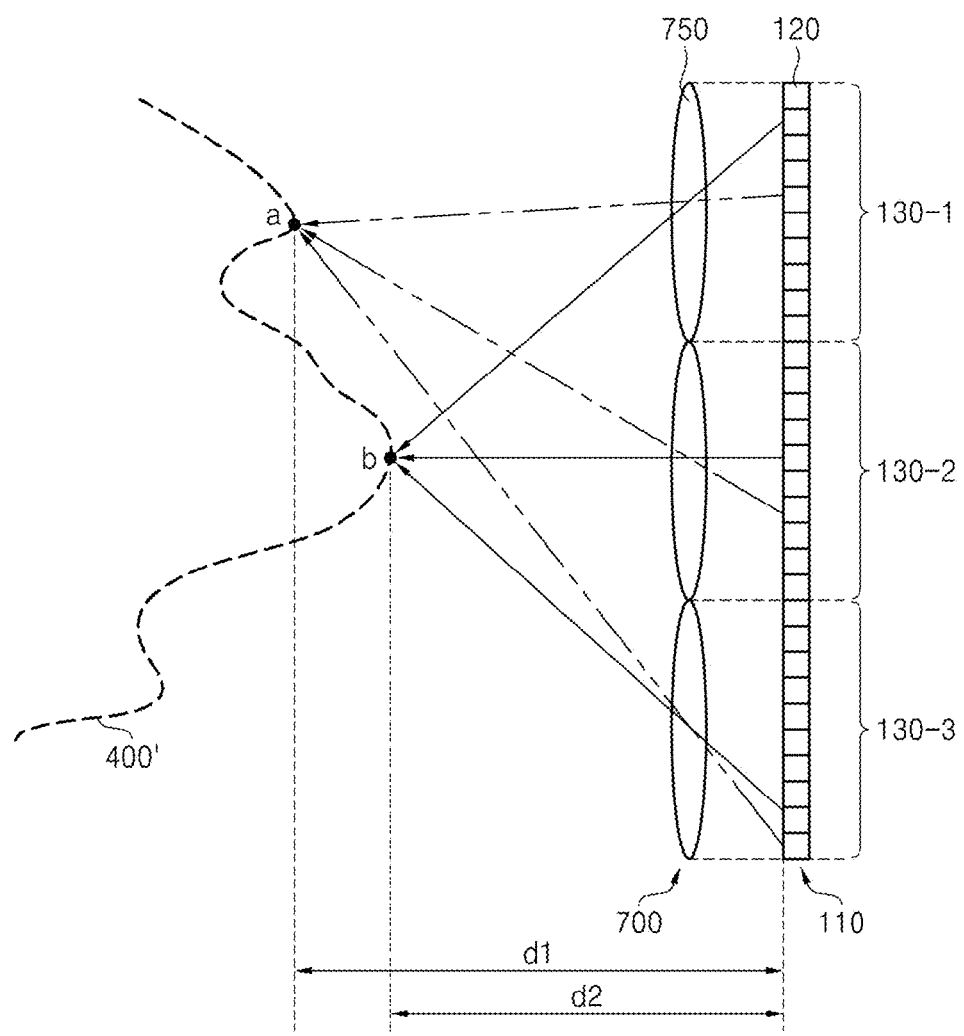
FIG. 6B is a diagram for explaining the operations of the image signal processor illustrated in FIG. 1 according to other example embodiments of inventive concepts.

FIG. 6B is a diagram for explaining example operation of the image signal processor 220 illustrated in FIG. 1 according to other example embodiments of inventive concepts. Referring to FIG. 1 and FIGS. 3 through 6B, the angular information of the spot "a" includes information about which sub-pixel in each of the first through third sub-pixel groups 130-1 through 130-3 has sensed the spot "a" and information about the relative position of each of the first through third sub-pixel groups 130-1 through 130-3 in the sub-pixel array 110. The image signal processor 220 may perform back-projection in three-dimensional (3D) space using the angular information of the spot "a" and calculate a relative distance d1 from the spot "a" to the sub-pixel array 110 in a 3D form 400' of the object 400.

The image signal processor 220 may calculate a relative distance d2 from the spot "b" to the sub-pixel array 110 using the angular information of the spot "b" in substantially the same method as used to calculate the relative distance d1.

In other words, the image signal processor 220 may generate depth data of each spot on the object 400 using the angular information of the spot. Each spot on the object 400 may correspond to a pixel in a high-resolution image 72 in FIG. 7.

Figure 6C:
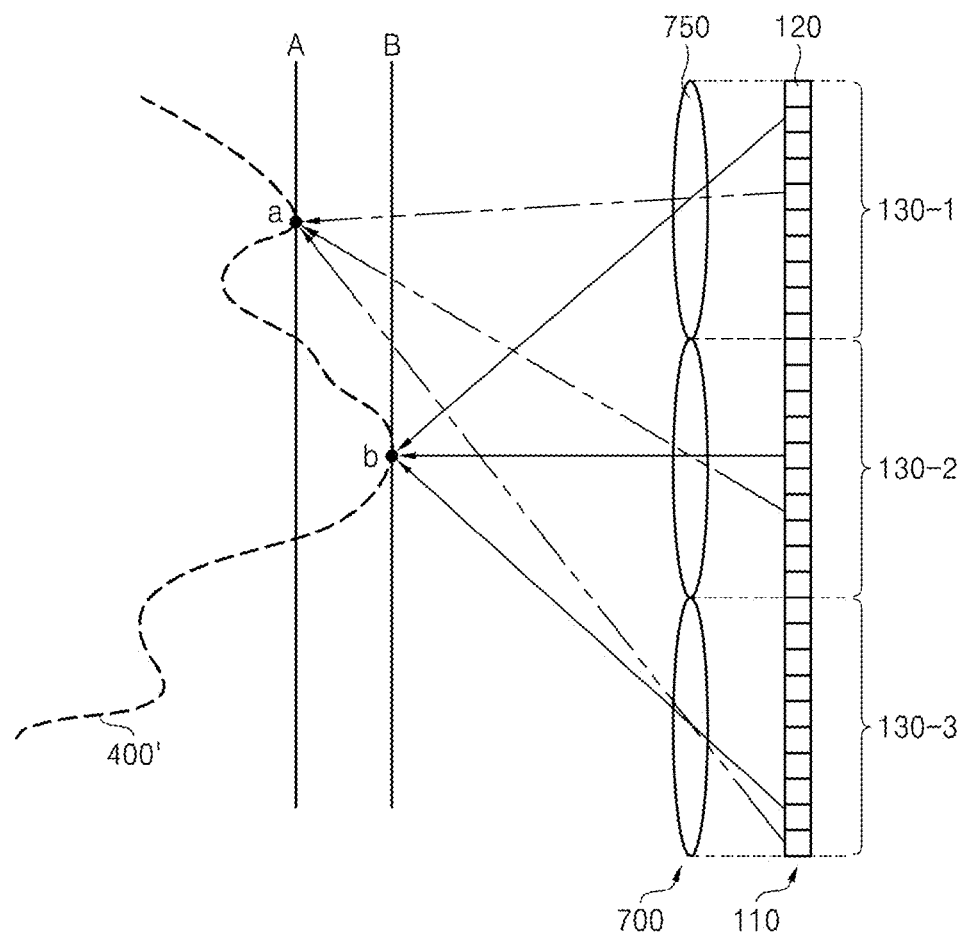
FIG. 6C is a diagram for explaining the operations of the image signal processor illustrated in FIG. 1 according to further example embodiments of inventive concepts.

FIG. 6C is a diagram for explaining example operation of the image signal processor 220 illustrated in FIG. 1 according to further example embodiments of inventive concepts. Referring to FIG. 1 and FIGS. 3 through 6C, the image signal processor 220 composes an image from first through third sub-pixel images respectively generated by the first through third sub-pixel groups 130-1 through 130-3 on the basis of a virtual image plane.

For instance, when the image signal processor 220 composes an image from the sub-pixel images by performing back-projection on a plane A, the image is in focus at the spot "a" on the object 400 but is out of focus at the spot "b". Contrarily, when the image signal processor 220 composes an image from the sub-pixel images by performing back-projection on a plane B, the image is out of focus at the spot "a" but is in focus at the spot "b".

In other words, the image signal processor 220 may refocus an image by determining a virtual image plane according to a spot to be focused when composing the image using the angular information of each spot on the object 400. Each spot on the object 400 may correspond to a pixel in the high-resolution image 72 in FIG. 7.

Figure 7:
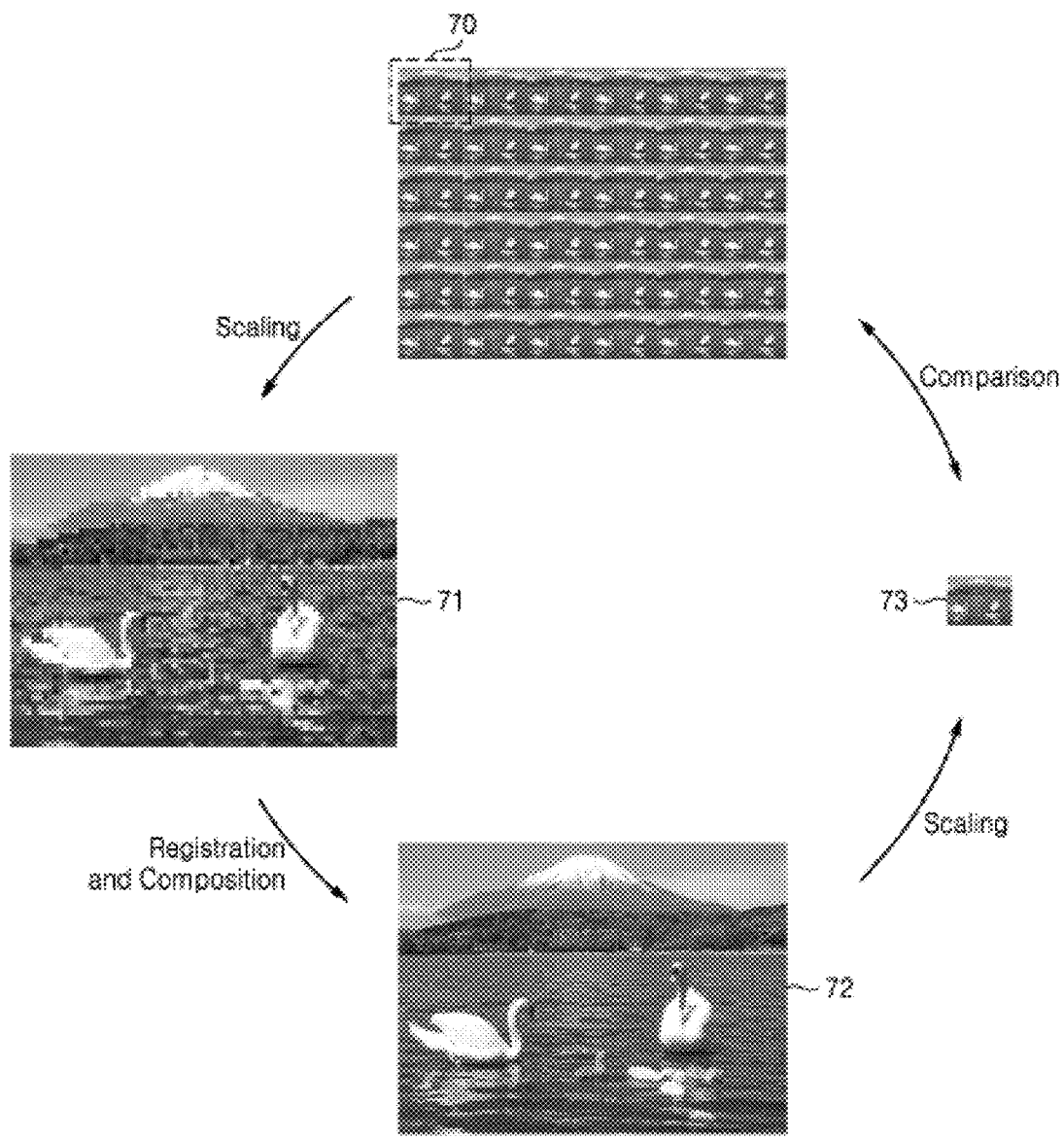
FIG. 7 is a diagram for explaining the operations of the image signal processor illustrated in FIG. 1 according to other example embodiments of inventive concepts.

FIG. 7 is a diagram for explaining example operation of the image signal processor 220 illustrated in FIG. 1 according to other example embodiments of inventive concepts. Referring to FIGS. 1 through 7, the image signal processor 220 may generate a plurality of light field images 70 without a procedure for making sub-pixel signals SPS into pixels (a case shown in FIG. 3) or with the pixelization procedure (a case shown in FIG. 4).

The image signal processor 220 may scale the light field images 70 to the resolution of a high-resolution image that is finally wanted to be generated. Accordingly, as many scaled light field images 71 as the light field images 70 may be generated.

The image signal processor 220 may compare the scaled light field images 71 with one another and perform registration. In detail, since the light field images 70 are obtained by sensing the object 400 at different positions in the sub-pixel array 110, the image signal processor 220 may perform a task of matching pixels (e.g., registration).

The image signal processor 220 may compose the high-resolution image 72 from the scaled light field images 71 that have been subjected to the registration. When generating the high-resolution image 72, the image signal processor 220 may scale the high-resolution image 72 to the size of the light field images 70 in order to correct a reconstruction error. The image signal processor 220 may compare a scaled high-resolution image 73 with one of the light field images 70 having no distortion and correct the reconstruction error in the high-resolution image 72.

Figure 8:
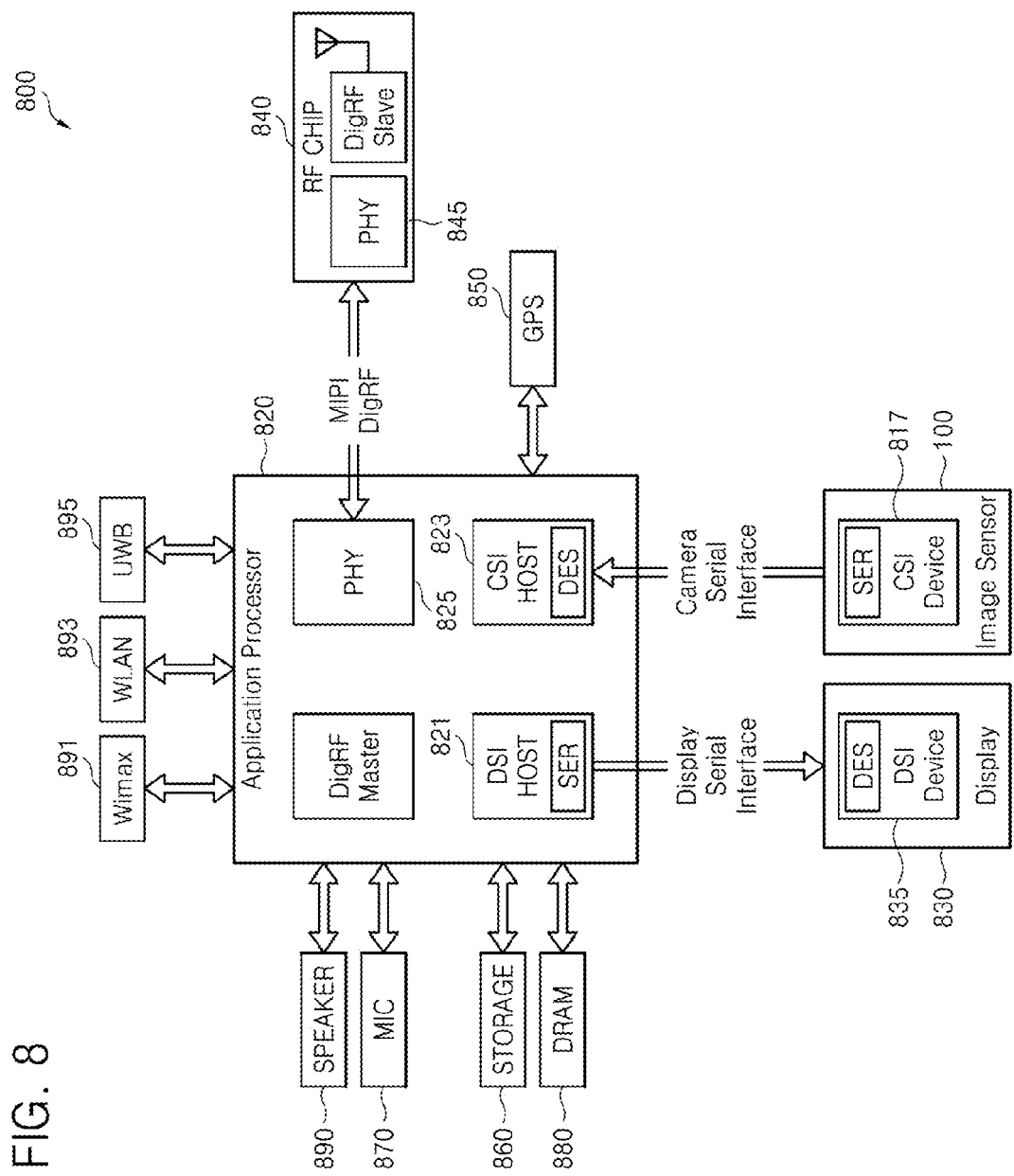
FIG. 8 is a block diagram of an image sensing system including the image sensor in FIG. 1 according to some example embodiments of inventive concepts.

FIG. 8 is a block diagram of an image sensing system including the image sensor in FIG. 1 according to some example embodiments of inventive concepts. Referring FIGS. 1 and 8, the image sensing system 800 may be implemented by a data processing apparatus, such as a mobile phone, a personal digital assistant (PDA), a portable media player (PMP), an IP TV, or a smart phone that can use or support the MIPI interface.

The image sensing system 800 includes the image sensor 100, an application processor 820 and a display 830.

A camera serial interface (CSI) host 823 included in the application processor 820 performs serial communication with a CSI device 817 included in a camera module 810 through CSI. For example, an optical de-serializer (DES) may be implemented in the CSI host 823, and an optical serializer (SER) may be implemented in the CSI device 817.

A display serial interface (DSI) host 821 included in the application processor 820 performs serial communication with a DSI device 835 included in the display 830 through DSI. For example, an optical serializer (SER) may be implemented in the DSI host 821, and an optical de-serializer (DES) may be implemented in the DSI device 835.

The image sensing system 800 may also include a radio frequency (RF) chip 840 which communicates with the application processor 820. A physical layer (PHY) 845 of the image sensing system 800 and a PHY of the RF chip 840 communicate data with each other according to a MIPI DigRF standard. The image sensing system 800 may further include at least one element among a GPS 850, a storage device 860, a microphone (MIC) 870, a DRAM 880 and a speaker 890. The image sensing system 800 may communicate using Wimax (world interoperability for microwave access) 891, WLAN (wireless lan) 893 and/or UWB (ultra wideband) 895, etc.

Figure 9:
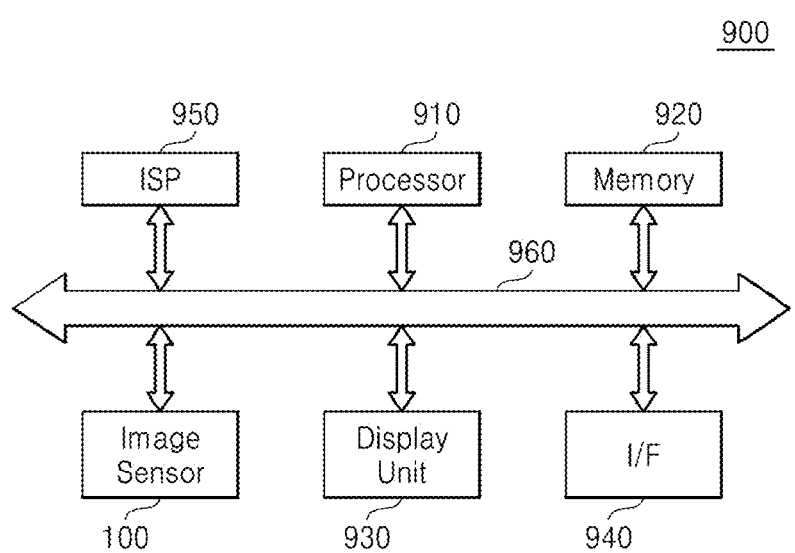
FIG. 9 is a block diagram of an image sensing system including the image sensor in FIG. 1 according to other example embodiments of inventive concepts.

FIG. 9 is a block diagram of an image sensing system including the image sensor in FIG. 1 according to other example embodiments of inventive concepts. Referring FIGS. 1 and 9, the image sensing system 900 may include the image sensor 100, a processor 910, a memory 920, a display unit 930, an interface 940 and an image signal processor 950.

The processor 910 may control the operation of the image sensor 100. The image signal processor 950 performs several operations (for example, image scaling and image enhancement) on signals output from the image sensor 100.

According to some example embodiments, the processor 910 and the image signal processor 950 may be implemented as a one chip. The image signal processor 950 may corresponds to the image signal processor 220 in FIG. 1.

The memory 920 may store commands for controlling the image sensor 100 and images generated by the processor 910 or the image signal processor 950 via a bus 960, and the processor may execute commands stored in the memory 920.

The display unit 930 may receive the images from the processor 910 or the memory 920, and display the received images through a liquid crystal display (LCD) device, a light emitting diode (LED) display device, an organic LED (OLED) display device, an active matrix organic light emitting diodes (AMOLED) display device or a flexible display device.

The interface 940 may be implemented as an interface for inputting/outputting the images. According to some embodiments, the interface 940 may be implemented as a wireless interface.

Inventive concepts may also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general inventive concept can be easily construed by programmers.

As described above, according to some example embodiments of inventive concepts, an image sensor and an image processor are implemented in a wafer stack in an image sensor chip, so that circuits included in the image sensor and the image processor are satisfactorily embodied.

While inventive concepts have been particularly shown and described with reference to exemplary embodiments thereof, it will be understood by those of ordinary skill in the art that various changes in forms and details may be made therein without departing from the spirit and scope of inventive concepts as defined by the following claims.

What is claimed is:

1. An image sensor chip comprising:
a first wafer including an image sensor having a plurality of sub-pixels, each of the plurality of sub-pixels being configured to detect at least one photon and to output a sub-pixel signal according to a result of the detection, the plurality of sub-pixels being grouped into first through n-th sub-pixel groups, each of the first through n-th sub-pixel groups including at least one of the plurality of sub-pixels; and
a second wafer including an image processor, the first wafer and the second wafer being formed in a wafer stack structure;
the image processor being configured to
process sub-pixel signals for each of the plurality of sub-pixels to generate first through n-th sub-pixel images, the first through n-th sub-pixel images corresponding to the respective first through n-th sub-pixel groups;
perform scaling and registration on the first through n-th sub-pixel images to generate a high-resolution image;
scale the high-resolution image to a size of at least one of the first through n-th sub-pixel images;
compare the scaled high-resolution image with one of the first through n-th sub-pixel images; and
correct a reconstruction error based on the comparing.

2. The image sensor chip of claim 1, wherein the image sensor chip further includes,
a micro lens array having first through n-th micro lenses corresponding to the first through n-th sub-pixel groups.

3. The image sensor chip of claim 2, wherein the image processor is further configured to generate angular information based on a comparison between at least two of first through n-th sub-pixel images output from the first through n-th sub-pixel groups.

4. The image sensor chip of claim 3, wherein the image processor is further configured to generate depth data corresponding to the high-resolution image based on the angular information.

5. The image sensor chip of claim 3, wherein the image processor is further configured to refocus the high-resolution image based on the angular information.

6. The image sensor chip of claim 1, wherein
the first wafer includes a plurality of dies, at least one die of the plurality of dies including the image sensor; and
the second waver includes another plurality of dies, at least one die of the other plurality of dies including the image processor.

7. The image sensor chip of claim 3, wherein the angular information includes direction angles of a light source in the at least two sub-pixel images.

8. The image sensor chip of claim 7, wherein the image processor is further configured to generate the angular information based on determined relative positions of the first through n-th sub-pixel groups on the first wafer.

9. The image sensor chip of claim 8, wherein the image processor is further configured to determine a relative distance between the light source and the plurality of sub-pixels based on the angular information.

10. The image sensor chip of claim 9, wherein the image processor is configured to,
determine a virtual image plane based on the determined relative distance, and
generate the high-resolution image based on the virtual image plane.

11. An image sensor chip comprising:
a first wafer including an image sensor having a plurality of sub-pixels and a plurality of pixels, each pixel including at least one of the plurality of sub-pixels, each of the plurality of sub-pixels being configured to detect at least one photon, and to output a sub-pixel signal according to a result of the detection, the plurality of sub-pixels being grouped into first through n-th sub-pixel groups, each of the first through n-th sub-pixel groups including at least one of the plurality of sub-pixels, the first through n-th sub-pixel groups being grouped into first through m-th pixel groups, each of the first through m-th pixel groups including at least one of the first through n-th sub-pixel groups; and
a second wafer including an image processor, the first wafer and the second wafer being in a wafer stack structure;
the image processor being configured to
process sub-pixel signals for each pixel to generate first through m-th pixel images, the first through m-th pixel images corresponding to the respective first through m-th pixel groups;
perform scaling and registration on the first through m-th pixel images to generate a high-resolution image;
scale the high-resolution image to a size of at least one of the first through m-th pixel images;
compare the scaled high-resolution image with one of the first through m-th pixel images; and
correct a reconstruction error based on the comparing.

12. The image sensor chip of claim 11, wherein the image sensor chip further includes,
a micro lens array including first through m-th micro lenses corresponding to the first through m-th pixel groups.

13. The image sensor chip of claim 12, wherein the image processor is further configured to generate angular information based on a comparison between at least two of first through m-th pixel images output from the first through m-th pixel groups.

14. The image sensor chip of claim 13, wherein the image processor is further configured to generate depth data corresponding to the high-resolution image based on the angular information.

15. The image sensor chip of claim 13, wherein the image processor is further configured to refocus the high-resolution image based on the angular information.

16. The image sensor chip of claim 11, wherein each of the plurality of sub-pixels includes one transistor.

17. An image sensor chip comprising: a first wafer including an image sensor having a plurality of sub-pixel groups of a sub-pixel array configured to generate sub-pixel signals; and
a second wafer including an image processor configured to,
generate a plurality of sub-pixel images of an object based on sub-pixel signals output from the plurality of sub-pixel groups of the sub-pixel array,
generate angular information associated with at least a first portion of the object based on a comparison between at least two of the plurality of sub-pixel images,
generate depth data associated with at least the first portion of the object based on the angular information,
generate a resultant image based on the plurality of sub-pixel images using the angular information and the depth data,
scale and register the resultant image to generate a high-resolution image,
scale the high-resolution image to a size of at least one of the plurality of sub-pixel images,
compare the scaled high-resolution image with one of the plurality of sub-pixel images, and
correct a reconstruction error based on the comparing;
wherein the first wafer and the second wafer are formed in a wafer stack structure.

18. The image sensor chip of claim 17, wherein the angular information associated with the first portion of the object includes position information associated with sub-pixels in the plurality of sub-pixel groups having sensed the first portion of the object.

19. The image sensor chip of claim 17, wherein the angular information associated with the first portion of the object includes a relative position of the plurality of sub-pixel groups in the sub-pixel array.

20. The image sensor chip of claim 17, wherein the image processor is further configured to scale and register the resultant image to generate a high-resolution image.

* * * * *